United States Patent [19]

Yamaguchi

[11] Patent Number: 5,274,417
[45] Date of Patent: Dec. 28, 1993

[54] EXPOSING APPARATUS AND METHOD OF FORMING IMAGE

[75] Inventor: Jun Yamaguchi, Fujinomiya, Japan

[73] Assignee: Fuji Photo Film Co., Ltd., Kanagawa, Japan

[21] Appl. No.: 826,835

[22] Filed: Jan. 28, 1992

[30] Foreign Application Priority Data

Jan. 29, 1991 [JP] Japan .................................. 3-9293
Mar. 6, 1991 [JP] Japan .................................. 3-40280
Nov. 22, 1991 [JP] Japan .................................. 3-307869

[51] Int. Cl.$^5$ .............................................. G03B 27/52
[52] U.S. Cl. ......................................... 355/30; 355/71
[58] Field of Search ....................... 355/30, 32, 35, 77, 355/88, 133, 132, 71, 1

[56] References Cited

U.S. PATENT DOCUMENTS 4,945,383 7/1990 Kobayashi et al. .................... 355/30
5,075,716 12/1991 Jehan et al. ............................ 355/1

FOREIGN PATENT DOCUMENTS 2065314 6/1981 European Pat. Off. .
0281105 9/1988 European Pat. Off. .
4120410 1/1992 Fed. Rep. of Germany .
57-117375 7/1982 Japan .

Primary Examiner—Richard A. Wintercorn
Attorney, Agent, or Firm—Sughrue, Mion, Zinn, Macpeak & Seas

[57] ABSTRACT

An exposing apparatus adapted for exposing a completely dry photosensitive recording medium which produces no waste and uses no developing solution, and which can expose a multicolor photosensitive recording medium quickly to form a clear image free from mixture of colors, and a method for forming high-quality color images with ease using the above exposing apparatus. The exposing apparatus includes a device for transmitting light whose wavelength corresponds to a spectral response of the photosensitive recording medium, which device is interposed between an exposing light source and the photosensitive recording medium, and a device for shielding a heat ray from the exposing light source, which device is interposed between the device for transmitting light whose wavelength corresponds to the spectral response and the exposing light source. The method for forming an image uses such exposing apparatus and forms the image by exposing a heat developed photosensitive recording medium a plurality of times and then heating the exposed photosensitive recording medium substantially uniformly, the heat developed photosensitive recording medium forming a latent image on a photocuring composition by exposure and causing a component having to do with coloring or discoloring by heating to migrate within itself (the recording medium) in accordance with the latent image.

13 Claims, 2 Drawing Sheets

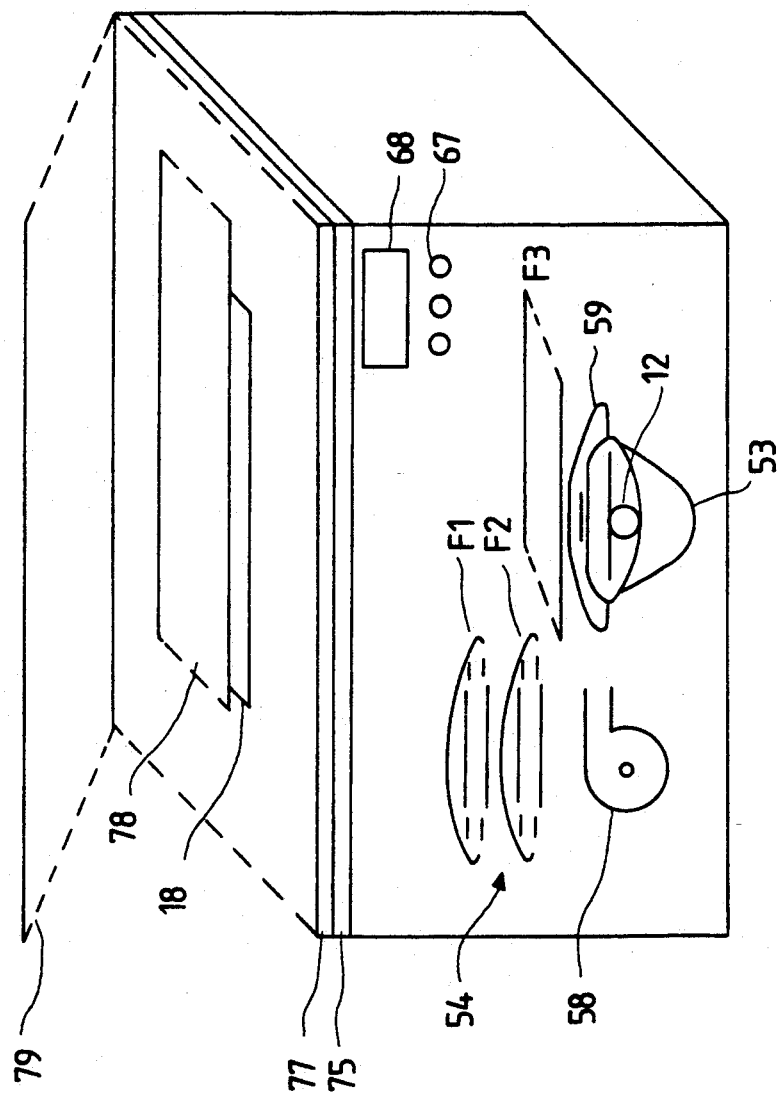

EXPOSING APPARATUS AND METHOD OF FORMING IMAGE

BACKGROUND OF THE INVENTION

The present invention relates to an exposing apparatus for preparing documents such as color proofs, slides, OHP (overhead projector) sheets, transparencies, copies, and facsimile documents. More particularly, the invention is directed to an exposing apparatus and a method for forming images using such exposing apparatus, in which a heat-developed photosensitive recording medium that produces color images using only heat developing is exposed in a simple manner without causing crosstalk and without use of additional sheets.

The invention may be applied extensively to color proofs, slides, OHP sheets, transparencies, copies, and facsimile documents, etc. While the invention will hereunder be described while taking a color proof as an example for convenience, it goes without saying that the invention provides similar effects in its other applications.

Color proofs can be produced by various methods, each of which has some shortcomings.

An overlay method is a typical color proof producing method. This method reproduces an image by overlaying films of different colors. It is essential that the image be observed through the films, thus impairing the quality of the image.

As a method for producing an image on a single sheet, a sur-print method is available. This method produces an image by sequentially superimposing four color photosensitive films on a single substrate. While "Chromarine" (E.I. DuPont Co.), "Match Print" (3M Co.), and "Color Art" (Fuji Photo Film Co., Ltd.) are known as sur-print methods, all of these methods require four photosensitive films and consequently produce waste.

A color paper method in which a color image is formed on a single photosensitive sheet is also known. This method forms a color image by causing a film original to contact a sheet of color paper, exposing the color paper using filters of different colors, and subjecting the exposed paper to a wet developing process. "Fine Checker" (Fuji Photo Film Co., Ltd.) and "Consensus" (Konishiroku Photo Industry Co., Ltd.) are known versions of this method. This method, wherein the photosensitizing range of the color paper falls within a visible range, involves the requirement that the process be performed in a darkroom or with an exposing device having a light-tight chamber. Moreover, significant maintenance and management are required for the developing solution.

All of these methods have shortcomings, such as requiring a plurality of sheets, producing waste including transfer sheets and toner, and involve difficulties in handling in a bright room, or in calling for a developing system using a developing solution.

To obviate the above shortcomings, a method has been proposed which employs a heat-developed photosensitive recording medium that forms a latent image on a photocuring composition by exposure and forms a color image by causing a component to be diffused within the photosensitive material in accordance with the latent image, the component having to do with coloring or discoloring by heating. The method forms a color image by passing an original of the image into an exposing section, exposing the photosensitive recording medium, forming a latent image by photocuring at the exposing section, thereafter diffusing a nonphotocured portion having to do with coloring or discoloring by heating the photosensitive recording medium, and forming a visible image. This is a completely dry system producing no waste.

Several photosensitive recording media are available for this method. While these media are advantageous in forming monochromatic images, they are more advantageous when used as color recording media.

An exemplary recording medium is disclosed, e.g., in Japanese Patent Unexamined Publication No. 89915/1977. This medium is prepared by arranging two components of a binary thermosensitive coloring media, e.g., an electron accepting compound and an electron donating achromatic dye, either inside and outside a microcapsule containing a photocuring composition or so as to be separated from each other on both sides of the microcapsule. However, this medium allows the photocuring composition within the microcapsule to be sufficiently hardened, but cannot suppress the coloring of the photocured portion adequately. As a result, the nonimage portion does get slightly colored, thereby exhibiting a tendency to impair the contrast.

A more preferred medium free from such coloring of the nonimage portion is disclosed, e.g., in Japanese Patent Unexamined Publication No. 123838/1986. This recording media is a lamination formed of a layer incorporating a photopolymerizing composition consisting of a vinyl monomer having an acid base and a photopolymerization initiator, an isolating layer, and an electron-donating achromatic dye. With this medium, a substantial absence of thermal diffusion of the acid base in a portion hardened by the nonimage portion, i.e., the photopolymerized portion, leads to elimination of the coloring of the nonimage portion, but the coloring density is somewhat low.

As a method for obtaining a negative image by a similar method, a method disclosed, e.g., in Japanese Patent Unexamined Publication No. 119552/1985 is known. This method involves use of a recording medium in which a photopolymerizing composition consisting of a monomer or prepolymer for bleaching a coloring matter and a photopolymerization initiator coexists with the coloring matter to be bleached by the monomer or prepolymer so as to be isolated from each other. This material also has problems similar to those of the above media.

The most preferred medium that has overcome the problems of coloring the nonimage portion and reducing the image density is a medium disclosed in co-assigned Japanese Patent Unexamined Publication No. 87827/1991. In this medium, one of the two components of a binary thermosensitive coloring medium is enclosed in microcapsules, and the other component is arranged outside the microcapsules as a curing compound of a photocuring composition or together with the photocuring composition.

A negative image producing medium based on a similar concept is disclosed in co-assigned Japanese Patent Application No. 16788/1991. This recording medium has a coating of a layer consisting of a photopolymerizing composition containing an electron accepting compound, a copolymerizing vinyl monomer, and a photopolymerizing initiator outside microcapsules, with the microcapsules containing an electron-donating achromatic dye.

To produce a color recording with these photosensitive recording media, a recording medium having a plurality of photosensitive layers whose photosensitizing wavelengths and hues to be obtained by heat development are different from one another may generally be used. The recording media disclosed in Japanese Patent Unexamined Publication No. 87827/1991 and Japanese Patent Application No. 16788/1991 are exemplary preferred multicolor recording media. For example, a multicolor recording medium having a plurality of photosensitive layers, each corresponding to a different color, and such plurality of photosensitive layers consist of at least two photosensitive layers laminated on a substrate from the side of an exposing light source to the side of a carrying body of the recording medium in the order of: a first photosensitive layer which is photosensitized by light whose center wavelength is $\lambda 1$; an intermediate layer absorbing light whose center wavelength is $\lambda 1$; a second photosensitive layer which is photosensitized by light whose center wavelength is $\lambda 2$ and giving a color that is different from a color given by the first photosensitive layer; an intermediate layer absorbing light whose center wavelength is $\lambda i - 1$; and an i−th photosensitive layer which is photosensitized by light whose center wavelength is $\lambda i$ and giving a color that is different from the colors given by the first and second photosensitive layers. The multicolor recording medium also satisfies the following relationship among the center wavelengths:

$$\lambda 1 < \lambda 2 < \ldots < \lambda i$$

where i is a positive integer not less than 2.

This photosensitive recording medium, being of a monosheet type, absorbs visible light rays when its center wavelength $\lambda j$ is set to the visible range, j being not less than 1, thus causing itself to be colored. For this reason, it is desirable that the center wavelength be out of the ultraviolet range. In the case of a photosensitive recording medium having coloring layers for cyan, magenta, and yellow, it is desirable to set three different center wavelengths outside the ultraviolet range. More specifically, it is desired that the three center wavelengths be limited within about 120 nm between about 450 nm and 330 nm, which is the widest possible range. The lower limit 330 nm is the shortest wavelength which the supporting glass plate of the exposing apparatus and a lith original can transmit, whereas the upper limit 450 nm or so is a wavelength that permits the recording medium to be colored.

On the other hand, it is necessary to use, as exposing light sources for exposing this photosensitive recording medium, light rays of the respective three regions into which this narrow range of about 120 nm is divided. The requirement is that a light source of a single color be used to photosensitize only a single coloring layer, and to meet this requirement, a bandpass filter is desirably used. An interference filter, with which a sharp bandpass filter whose half-width is narrow can be designed, is advantageous. However, when trying to divide this narrow range of about 120 nm into three regions using an ordinary planar interference filter, a troublesome phenomenon called "crosstalk" may occur.

For example, when exposing the photosensitive recording medium in the region of a wavelength $\lambda 2$, crosstalk with components $\lambda 1$ and/or $\lambda 3$ of the injected light passing through the filter photosensitize photosensitive layers other than the $\lambda 2$ photosensitive layer may occur. An image obtained from the development of the photosensitive recording medium which is affected by such crosstalk produces a color different from the color expected from the original.

Further, since the interference filter is expensive, it is desirable to use a smaller interference filter, which, in turn, requires that the interference filter be disposed adjacent to the light source. When the interference filter is located adjacent to the light source, the interference filter gets heated by the heat produced by the light source. It has further been found, surprisingly, that bandpass characteristic of the interference filter changes with increasing temperature, drifting the transmitted light region to about 10 nm. As a result, the transmitted light extends beyond each region that is about 40 nm or less in width.

Accordingly, while these photosensitive recording media exhibit excellent properties in experimental terms, no system capable of forming images which are practically large enough has been developed yet.

SUMMARY OF THE INVENTION

Accordingly, an object of the invention is to provide an exposing apparatus suitable for exposing a photosensitive recording medium in a completely dry manner while using no developing solutions, etc. and producing no waste. The invention also provides an exposing apparatus allowing quick exposure to produce a sharp image free from mixture of colors.

Another object of the invention is to provide a method for forming color images whose quality is excellent using such exposing apparatus.

The above and other objects of the invention can be achieved by an exposing apparatus that exposes a photosensitive recording medium while superposing an original of an image over the photosensitive recording medium. The invention also provides a method for forming an image using such an exposing apparatus.

The inventive exposing apparatus is characterized in that a device for transmitting light whose wavelength corresponds to a spectral response of the photosensitive recording medium is interposed between an exposing light source and the photosensitive recording medium, a device for shielding heat rays from the exposing light source is interposed between the device for transmitting light whose wavelength corresponds to the spectral response and the exposing light source. The method for forming an image using such exposing apparatus is characterized by exposing a heat developable photosensitive recording medium a plurality of times, and then heating the exposed photosensitive recording medium substantially uniformly, the heat-developed photosensitive recording medium forming a latent image on a photocuring composition by exposure and causing a component having to do with coloring or discoloring by heating to migrate within itself (the recording medium) in accordance with the latent image.

BRIEF DESCRIPTION OF THE DRAWINGS

FIG. 2 is a diagram showing an exemplary exposing apparatus of the invention into which a light source using filters is assembled.

DESCRIPTION OF THE PREFERRED EMBODIMENTS

Figure 1:
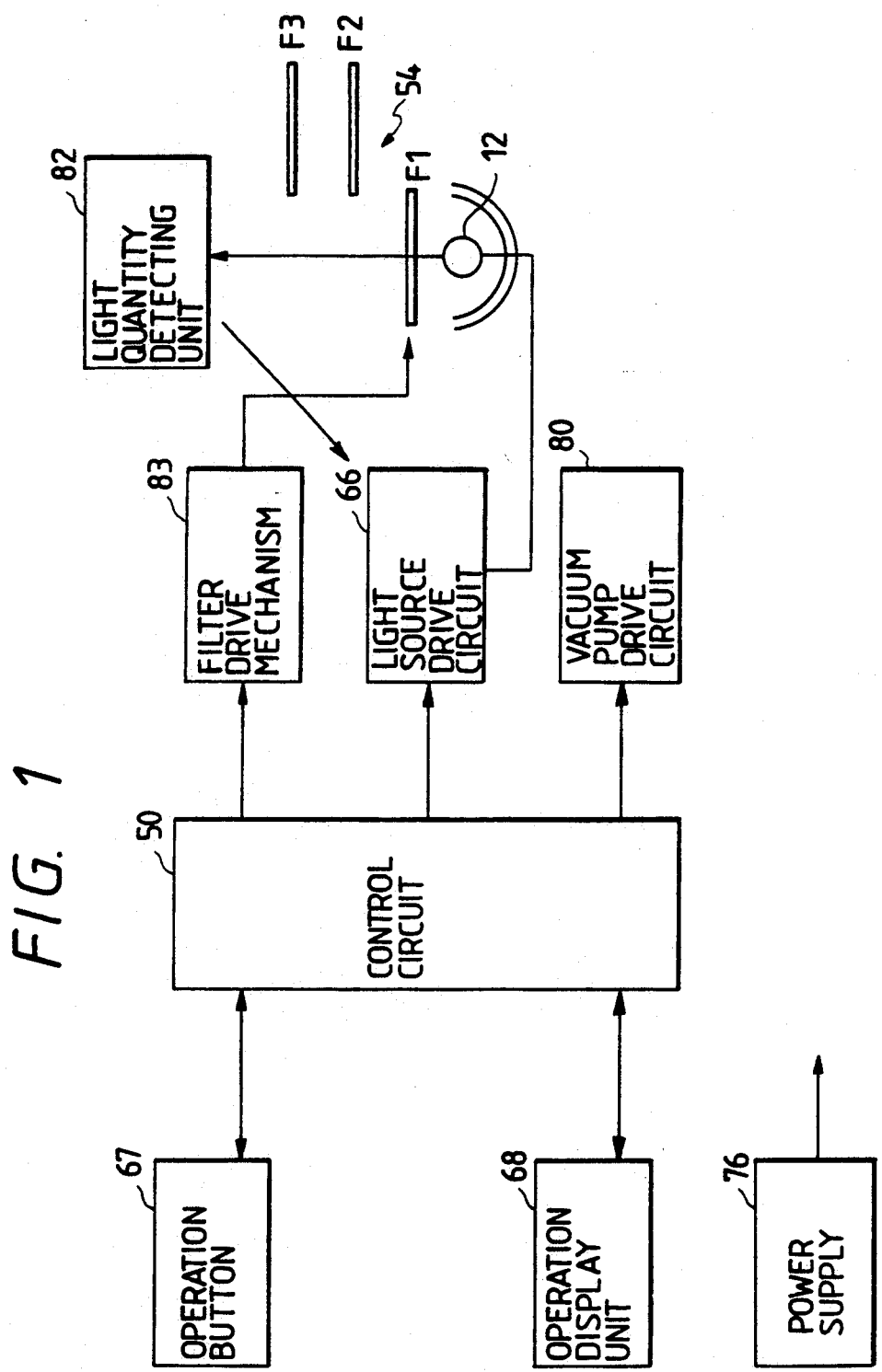
FIG. 1 is a functional block diagram showing an exemplary circuit configuration of an exposing apparatus of the invention.

Preferred embodiments of the invention will hereunder be described in detail with reference to the attached drawings.

In this description, a multilayer film interference filter 54 is exemplified as a device which is interposed between the exposing light source and the photosensitive recording medium, and which transmits light whose wavelength corresponds to the spectral response of the photosensitive recording medium.

Preferred examples of the multilayer film interference filter 54 include metallic interference filters such as an MIF-W type filter (manufactured by Nippon Vacuum Optical Co., Ltd.), all dielectric interference filters, such as, e.g., a DIF type filter (same as above) and a dichroic filter (same as above). Such filters can be used either individually or in combination.

It is preferable to use interference filters in which the thickness of the multilayer film is increased from the center to the periphery, and to use interference filters having a convex surface. The use of such filters contributes to greatly reducing variation in the center wavelength of transmitting light caused by variation in the angle of injection of light onto the filter.

A preferred average radius of curvature of the interference filter having a convex surface is about one-half to four times as large as the distance between the light source and the interference filter, or more preferably 1/1.15 to two times as large.

Any larger or smaller average radius of curvature than the above increases the distribution of transmitting wavelengths on the exposing surface of the exposing apparatus. This radius of curvature is not necessarily constant over the entire surface of the interference filter, but may be acceptable as long as the radius of curvature of its main portion falls within the above range. For example, the light passes through the center portion of the interference filter relatively perpendicularly, and thus the center portion thereof may be planar.

The term "average radius of curvature" herein used has the following meaning. As described above, the shape of the convex surface of the interference filter may not be the same at the center and at the periphery, but the reciprocal of the arithmetic mean of reciprocal of the radii of curvature of the respective convex surfaces is defined as the average radius of curvature, and it is required that such an average radius of curvature be within the above range.

The thickness of an interference film of the interference filter having this convex surface may not be constant from the center to the periphery; it is desirable to have such a thickness distribution that the thickness at the periphery is larger.

The interference filter may have a shape, which is equivalent to a part of a cylinder, a sphere, an ellipse, etc. If a so-called point source is used, a multilayer film interference filter having a shape equivalent to a part of a sphere or a shape analogous to a sphere is preferable.

This filter is disposed so that its convex surface confronts the original of an image.

The interference filter having such a convex surface can be prepared by various methods. For example, a multilayer film may be formed on a substrate having a desirable convex surface such as glass by various known methods including a vacuum evaporation method, a sputtering method, an ion plating method, a chemical vapor deposition (CVD) method, a sol-gel method, etc. Otherwise, a planar interference filter may be machined to have a desired convex surface.

A multilayer film interference filter whose multilayer film thickness varies from the center to the periphery may also be formed by various known methods. For example, the vacuum evaporation method includes a method for horizontally rotating a substrate with its center as an axis of rotation while arranging an evaporation source around its periphery and a method for evaporating the evaporation source by changing the distance from the evaporation source to the substrate while arranging the evaporation source around the periphery of the substrate.

This multilayer interference filter may be formed by combining a film-like filter having a known coloring matter with a color glass filter, or a part of the multilayer film interference filter may be replaced with any of these filters.

An exemplary film-like filter having a coloring matter which can be used as a coloring matter filter is a SC41 filter (manufactured by Fuji Photo Film Co., Ltd.), whereas an exemplary glass filter having a coloring matter which serves the same purpose as the above is an L-42 filter (manufactured by Toshiba Glass Co., Ltd.).

As a device for shielding heat rays from the light source, a heat-ray blocking filter 59 or a heat-ray blocking glass may preferably be used. Various types of glass, such as quartz glass, Pyrex® glass, white plate glass, blue plate glass, or a glass on which an infrared ray reflecting layer is formed may be used.

This heat-ray blocking filter or heat-ray blocking glass may also preferably have a convex surface. Accordingly, uniformity in illuminance at the center and at the periphery of the exposing surface can be remarkably increased when an interference filter having a convex surface is used.

The shape of the heat-ray blocking filter or heat-ray blocking glass is preferably convex having an average radius of curvature smaller than or substantially equal to that of the interference filter. A more preferred average radius of curvature is 1/10 to 100 times as large as that of the interference filter, and a still further preferred average radius of curvature is $\frac{1}{4}$ to 4 times as large as that of the interference filter.

If a flat, plate-like heat-ray blocking filter or heat-ray blocking glass is used, the illuminance at the center of the exposing surface exhibits a tendency to abnormally increase, due possibly to multipath reflection of the light between itself and the interference filter having a convex surface. This is not desirable.

Specific shapes of the heat-ray blocking filter or heat-ray blocking glass having a convex surface are similar to those described above.

The infrared filter or the heat-ray blocking glass is preferably air-cooled or water-cooled. Any conventionally known method for air-cooling or water-cooling can be employed.

For color exposure, various filters, each corresponding to a required transmitting wavelength, and a combination of such filters can be selected in the following manner. For exposure of a layer to be photosensitized by light of long wavelengths, a sharp-cut filter including a SC41 filter which can cut light of short wavelengths $\lambda 1$, $\lambda 2$ is selected, for exposure of a layer to be photosensitized by light of middle wavelengths, a combination of a bandpass filter, e.g., a metallic interference filter (manufactured by Nippon Vacuum Optical Co., Ltd.) with a filter having a coating of superfine zinc oxide (ZnO-100 manufactured by Sumitomo Cement Co., Ltd.) on a piece of glass is employed, etc.

In the exposing apparatus of the invention, a reflecting plate or concave mirror 53 for transmitting heat rays from the exposing light source and reflecting ultraviolet rays and/or visible light rays may be disposed at a position opposite to the device for shielding the heat rays. For this purpose, the multilayer film interference filter layer may be formed on a glass selected from various types of glass including quartz glass, Pyrex® glass, white plate glass, and blue plate glass.

A pressing glass 77 for causing the original to contact the photosensitive recording medium in the exposing apparatus of the invention may be made of quartz glass, Pyrex® glass (manufactured by Dow Corning, Ltd.), Iwaki Code 7740 glass (manufactured by Iwaki Glass Co., Ltd.), Duran glass (manufactured by Schott), Hario-32 glass (manufactured by Shibata Scientific Equipment Industry Co., Ltd.), Museum glass (manufactured by Asahi Glass Co., Ltd.), blue plate glass, etc.

A photosensitive recording medium 78 to be used with the invention will now be described.

This recording medium has a photosensitive/thermosensitive layer at least on one surface of a carrying body, the photosensitive/thermosensitive layer forming an image by forming a latent image on its photocuring composition by exposure and causing a component having to do with coloring or discoloring by heating to migrate within the recording medium in accordance with the latent image.

More specifically, the recording material disclosed, e.g., in Japanese Patent Unexamined Publication No. 87827/1991 is one such example. This recording material has a coating of a layer containing a compound having an electron-accepting portion and a copolymerizing vinyl monomer portion within a single molecule, a photopolymerizing composition containing a photopolymerization initiator, and microcapsules enclosing an electron-donating achromatic dye, the former two being outside the microcapsules. When this recording material is exposed, the exposed portion of the photopolymerizing composition outside the microcapsule is polymerized to form a latent image and, when heated thereafter, the electron-accepting compound starts diffusing within the material in accordance with the latent image to color the electron-donating achromatic dye within the microcapsule and thereby form a positive color image having an excellent contrast.

A specific exemplary material for forming a negative image is disclosed, e.g., in Japanese Patent Application No. 16788/1991. This recording material has a coating of a layer containing an electron accepting compound, a polymerizing vinyl monomer, a photopolymerizing composition containing a photopolymerization initiator, and microcapsules enclosing an electron-donating achromatic dye, the former three being outside the microcapsules. When this recording material is exposed, the exposed portion of the photopolymerizing composition outside the microcapsules is polymerized to form a latent image, and when heated thereafter, the electron-accepting compound of the polymerized portion starts diffusing within the material in accordance with the latent image to color the electron-donating achromatic dye within the microcapsules and thereby form a negative image having an excellent contrast.

The photosensitive/thermosensitive layer used on these recording materials is not limited to the above examples, but may take various compositions in accordance with the intended purpose.

The multicolor photosensitive recording medium to be used in the practice of the invention can be a multilayer recording material including microcapsules containing an electron-donating achromatic dye that gives a different color hue and a photocuring composition that is photosensitized by light of different wavelength in each of its layers. For example, such multilayer recording material may be formed by depositing a layer including microcapsules containing an electron-donating achromatic dye that gives cyan and a photocuring composition that is photosensitized by a wavelength $\lambda 3$ on a carrying body, a layer having a microcapsule containing an electron-donating achromatic dye that gives magenta and a photocuring composition that is photosensitized by a wavelength $\lambda 2$ thereon, and a layer including microcapsules containing an electron-donating achromatic dye that gives yellow and a photocuring composition that is photosensitized by a wavelength $\lambda 1$ thereon. Otherwise, an intermediate layers may be interposed between any two layers. Further, each intermediate layer may contain an ultraviolet-ray absorbing agent.

In this case, the arrangement where the ultraviolet-ray absorbing agent is contained in the intermediate layer is particularly preferred. An exemplary material of such arrangement is formed by depositing a layer including microcapsules containing an electron-donating achromatic dye that gives cyan and a photocuring composition that is photosensitized by a wavelength $\lambda 3$ on a carrying body, an intermediate layer containing an ultraviolet-ray absorbing agent that absorbs light of wavelength shorter than the wavelength $\lambda 3$ thereon, a layer including microcapsules containing an electron-donating achromatic dye that gives magenta and a photocuring composition that is photosensitized by a wavelength $\lambda 2$ thereon, an intermediate layer containing a ultraviolet-ray absorbing agent that absorbs light of wavelength shorter than the wavelength $\lambda 2$ thereon, a layer including microcapsules containing an electron-donating achromatic dye that gives yellow, and a photocuring composition that is photosensitized by a wavelength $\lambda 1$ thereon, and further a protective layer thereon.

The layer arrangement and the various materials for forming photosensitive/thermosensitive layers are described in detail in the above two specifications.

In the method for forming an image of the invention, such a photosensitive recording medium is exposed by the exposing apparatus of the invention and is then heated substantially uniformly. A mechanism for obtaining a full-color image by this method and some mechanisms to be preferably added to the exposing apparatus of the invention are described in detail in Japanese Patent Applications Nos. 176826/1990 and 176828/1990, for instance.

While preferred embodiments of the invention and specific examples thereof will be described hereunder, the application of the invention is not limited to such embodiments and examples.

EXAMPLE 1

FIG. 1 is a functional block diagram showing an exemplary circuit configuration of an exposing apparatus of the invention, and FIG. 2 is a diagram showing an exemplary exposing apparatus into which a light source unit of the invention is assembled.

In FIGS. 1 and 2, reference numeral 54 designates a group of multilayer film interference filters consisting of F1, F2, F3, which are depicted as a plane for the sake of simplicity.

Reference numeral 59 designates a heat-ray blocking filter, which is similarly depicted as a plane.

Reference numeral 67 designates an operation button. By pressing this button, a desired filter is selected from the filter group 54, and at the same time, a space between a glass plate 77 and a pressing cover 79 is evacuated to cause an original 18 to come in contact with a photosensitive recording medium 78, both the original 18 and the photosensitive recording medium 78 being interposed between the glass plate 77 and the pressing cover 78. A light source 12 is thereafter turned on for a predetermined time interval to expose the photosensitive recording medium 78. After the predetermined time interval has elapsed, the light source 12 is turned off and the evacuated space is brought back to atmospheric pressure. At the same time, the filter is removed from above the light source 12 to terminate a series of single color exposing operations. To produce a multicolor image, the same o operations are repeated.

Reference numeral 68 designates an operation display section, which can display the type of an interference filter selected from the filter group 54 and the time interval required to terminate the operation, etc.

Reference numeral 12 designates the light source, for which a mercury lamp is preferably used. The light source 12 is driven by a light source drive circuit 66 under the control of a control circuit 50.

Reference numeral 18 designates the photosensitive recording medium, and 58, an air cooling unit.

FIG. 2 presents an exemplary exposing apparatus into which an exposing light source unit of the invention is assembled. When a multicolor recording medium is used as the recording medium 78, the multicolor recording medium is first exposed by light whose center wavelength is λ1 that has passed through the filter F1, and then exposed by light whose center wavelength is λ2 while replacing the filter F1 with the filter F2, and finally exposed by light whose center wavelength is λ3 while replacing the filter F2 with the filter F3 (all filters are depicted as planes for convenience).

Reference numeral 53 designates a convex mirror that transmits heat rays and reflects ultraviolet rays and/or visible rays.

Reference numeral 80 designates a Fresnel lens.

EXAMPLE 2

The recording medium was exposed three times with an AEL light source (manufactured by Fusion) of 6 kW using: (1) an MIF-W type filter (manufactured by Nippon Vacuum Optical Co., Ltd.) which transmits light whose center wavelength is 328 nm and which is formed on a piece of glass whose radius of curvature R is 250 as the F1 filter, another MIF-W type filter (same as above) which transmits light whose center wavelength is 378 nm and which is formed on a similar piece of glass as the F2 filter, and an SC41 filter (manufactured by Fuji Photo Film Co., Ltd.); (2) using a Pyrex ® glass whose radius of curvature R is 250 as the heat-ray blocking glass; and (3) using the recording medium disclosed in Japanese Patent Application No. 16788/1991.

The distance between the light source and the interference filter was 220 mm, and the distance between the light source and the heat-ray blocking glass was 110 mm.

After the exposure, the recording medium was subjected to a 1-5 second heat development process using a heat roller heated to 120°C. The obtained image was clear and free from fog both at the center and at the periphery, as well as free from crosstalk.

EXAMPLE 3

Instead of the interference filter having a convex surface of Example 2, the following filters, in which the thickness of its thin film is changed from the center toward the periphery, were used:

Let a function of the angle $\phi$ formed between an imaginary line drawn perpendicularly from the light source and an imaginary line drawn from the light source toward an arbitrary part of the filter be expressed as:

thickness of thin film at an arbitrary position = thickness of the thin film at the center / $\sin(\phi)$ The recording medium was subjected to exposure and development with the other conditions unchanged. As a result, a clear image was obtained, in which no fog was observed at the center and at the periphery, nor was any crosstalk present.

COMPARATIVE EXAMPLE 1

The recording medium was exposed and developed in the same manner as in Example 2 except that plane filters were used as the F1 and F2 filters.

While a clear image that was free from crosstalk at its center was obtained, its periphery suffered from cyan fog, reduced density, and magenta fog. The reason was that the oblique injection of light rays from the light source onto the F1 and F2 filters causes the transmitting wavelengths to be shorter than 328 and 378 nm, respectively. As a consequence, the cyan fog was induced at the periphery due to insufficient quantity of transmitting light, and reduced density and the magenta fog due to crosstalk between the cyan coloring layers.

COMPARATIVE EXAMPLE 2

The recording medium was exposed and developed in the same manner as in Example 2 except that a planar Pyrex ® glass was used as the heat-ray blocking glass. The obtained image was characterized by cyan and magenta fogs at the periphery due to intensive injection of light onto the center.

EXAMPLES 4 AND 5

A case where a Fresnel lens was provided as shown in FIG. 2 (Example 4) and a case where no such lens was provided (Example 5) were compared.

While the obtained image was clear with no color portions out of place on the entire surface in Example 4, slight out-of-place color portions were observed at a position about 40 cm away from the center.

The exposing apparatus and method for forming an image of the invention can produce clear full-color images free from o fog and crosstalk even at the periphery of the exposing apparatus, while producing no waste and with a simple operation involving image-forming exposure of a recording medium and heating of its entire surface.

What is claimed is:

1. An exposing apparatus for exposing a photosensitive recording medium while superposing an original of an image on said photosensitive recording medium, said apparatus comprising: a device for transmitting light whose wavelength corresponds to a spectral response of said photosensitive recording medium, and a device for shielding heat rays from an exposing light source, said light transmitting device being interposed between said exposing light source and said photosensitive recording medium, and said heat-ray shielding device being interposed between said device for transmitting light whose wavelength corresponds to the spectral response and said exposing light source, wherein said device for transmitting light whose wavelength corresponds to the spectral response comprises an interference filter.

2. An exposing apparatus according to claim 1, wherein said device for transmitting light whose wavelength corresponds to the spectral response of the photosensitive recording medium comprises an interference filter formed of a multilayer film having a convex surface, said convex surface being disposed so as to confront said original of the image.

3. An exposing apparatus according to claim 1, wherein an average radium of curvature of said convex surface of said interference filter is in a range of 1/10 to 100 times as large as a distance between said light source and said interference filter.

4. An exposing apparatus according to claim 1, wherein an average radius of curvature of said convex surface interference filter is in a range of one-half to four times as large as a distance between said light source and said interference filter.

5. An exposing apparatus according to claim 1, wherein an average radius of curvature of said convex surface of said interference filter is in a range of 1/1.15 to two times as large as a distance between said light source and said interference filter.

6. An exposing apparatus according to claim 1, wherein said device for shielding heat rays of the exposing light source comprises a heat-ray blocking filter.

7. An exposing apparatus according to claim 1, wherein said device for shielding heat rays of the exposing light source comprises a heat-ray blocking glass having a convex surface disposed so as to confront said multilayer film interference filter.

8. An exposing apparatus according to claim 7, wherein said convex surface of said heat-ray blocking glass has an average radius of curvature smaller than or substantially equal to the average radius of curvature of said convex surface of said interference filter.

9. An exposing apparatus according to claim 7, wherein said convex surface of said heat-ray blocking glass has an average radius of curvature in range of 1/10 to 100 times the average radius of curvature of said convex surface of said interference filter.

10. An exposing apparatus according to claim 7, wherein said convex surface of said heat-ray blocking glass has an average radiums of curvature in and range of ¼ to four times the average radius of curvature of said convex surface of said interference filter.

11. The exposing apparatus according to claim 1, wherein said interference filter is formed to a multilayer film, a thickness of said multilayer film increasing from the center toward the periphery of said filter.

12. An exposing apparatus for exposing a photosensitive recording medium while superposing an original of an image on said photosensitive medium, said apparatus comprising:
a device for transmitting light whose wavelength corresponds to a pectoral response of said photosensitive recording medium,
a device shielding heat rays from an exposing light source, and a Fresnel lends interposed between said original of the image and said device for transmitting light whose wavelength corresponds to the spectral response, said light transmitting device being interposed between said exposing light source and said photosensitive recording medium, and said heat-ray shielding device being interposed between said device for transmitting light whose wavelength corresponds to the spectral response and said exposing light source.

13. An exposing apparatus for exposing a photosensitive recording medium while superposing an original of an image on said photosensitive recording medium, said apparatus comprising:
a plurality of devices for transmitting light whose wavelength corresponds to a spectral response of said photosensitive recording medium, said transmitting devices each having a different center wavelength, a mechanism for selecting a one of said transmitting devices having a predetermined transmitting center wavelength for every exposure, and a device for shielding heat rays from an exposing light source, the selected light transmitting device being interposed between said exposing light source and said photosensitive recording medium, and said heat-ray shielding device being interposed between said device for transmitting light whose wavelength corresponds to the spectral response and said exposing light source.

* * * * *